United States Patent
Tran et al.

(10) Patent No.: US 9,171,830 B2
(45) Date of Patent: Oct. 27, 2015

(54) FABRICATING A PROXIMITY SENSOR HAVING LIGHT-BLOCKING STRUCTURE IN LEADFRAME

(71) Applicant: Texas Instruments Incorporated, Dallas, TX (US)

(72) Inventors: Andy Quang Tran, Grand Prairie, TX (US); Lance Wright, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/627,839

(22) Filed: Feb. 20, 2015

(65) Prior Publication Data
US 2015/0162317 A1    Jun. 11, 2015

Related U.S. Application Data

(62) Division of application No. 13/954,533, filed on Jul. 30, 2013, now Pat. No. 8,994,154.

(60) Provisional application No. 61/708,392, filed on Oct. 1, 2012.

(51) Int. Cl.
| | |
|---|---|
| H01L 21/44 | (2006.01) |
| H01L 21/48 | (2006.01) |
| H01L 21/50 | (2006.01) |
| H01L 25/16 | (2006.01) |
| H01L 27/14 | (2006.01) |
| H01L 21/82 | (2006.01) |
| H01L 31/0232 | (2014.01) |
| H01L 31/16 | (2006.01) |
| H01L 31/18 | (2006.01) |
| H01L 33/58 | (2010.01) |
| H01L 33/62 | (2010.01) |

(52) U.S. Cl.
CPC .............. *H01L 25/167* (2013.01); *H01L 21/82* (2013.01); *H01L 25/165* (2013.01); *H01L 27/14* (2013.01); *H01L 31/02325* (2013.01); *H01L 31/16* (2013.01); *H01L 31/18* (2013.01); *H01L 33/58* (2013.01); *H01L 33/62* (2013.01); *H01L 2224/48091* (2013.01); *H01L 2924/00014* (2013.01); *H01L 2924/1815* (2013.01); *H01L 2933/005* (2013.01); *H01L 2933/0058* (2013.01); *H01L 2933/0066* (2013.01)

(58) Field of Classification Search
CPC ............ H01L 21/4821; H01L 21/4825; H01L 21/4839; H01L 21/67236
See application file for complete search history.

(56) References Cited

U.S. PATENT DOCUMENTS

2007/0170228 A1* 7/2007 Zhao et al. .................... 228/102

*Primary Examiner* — Hoai V Pham
(74) *Attorney, Agent, or Firm* — Steven A. Shaw; Charles A. Brill; Frank D. Cimino

(57) ABSTRACT

A method for fabricating a semiconductor proximity sensor includes providing a flat leadframe with a first and a second surface. The second surface is solderable. The leadframe includes a first and a second pad, a plurality of leads, and fingers framing the first pad. The fingers are spaced from the first pad by a gap which is filled with a clear molding compound. A light-emitting diode (LED) chip is assembled on the first pad and encapsulated by a first volume of the clear compound. The first volume outlined as a first lens. A sensor chip is assembled on the second pad and encapsulated by a second volume of the clear compound. The second volume outlined as a second lens. Opaque molding compound fills the space between the first and second volumes of clear compound, forms shutters for the first and second lenses, and forms walls rising from the frame of fingers to create an enclosed cavity for the LED. The pads, leads, and fingers connected to a board using a layer of solder for attaching the proximity sensor.

5 Claims, 2 Drawing Sheets

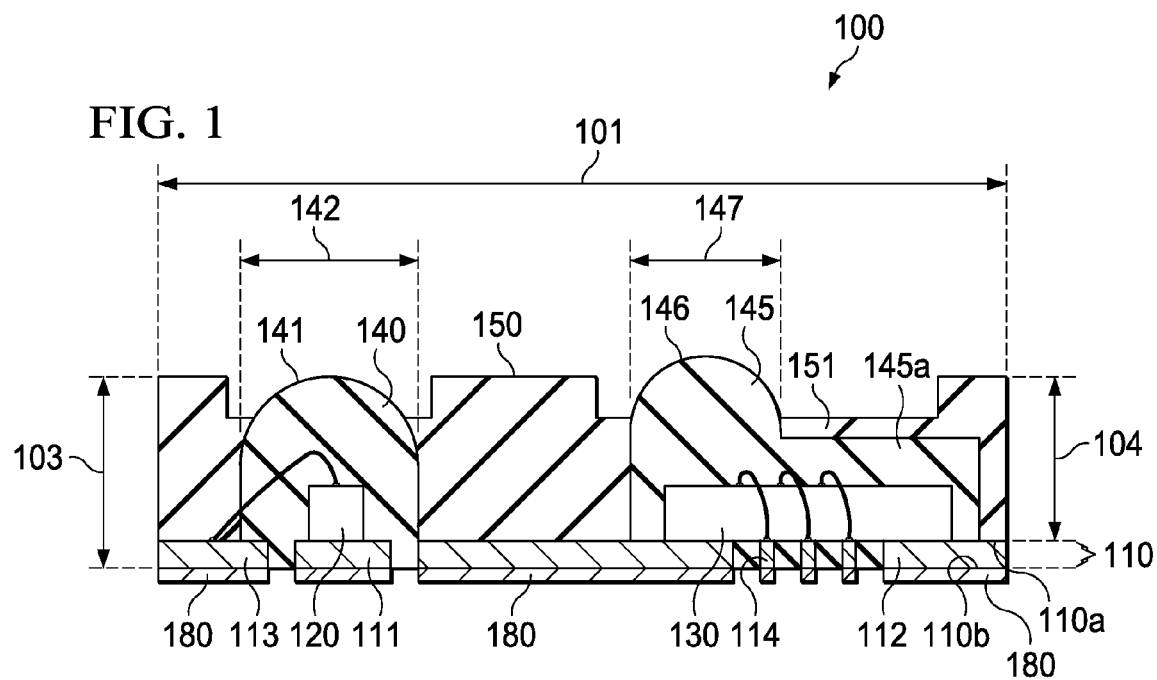
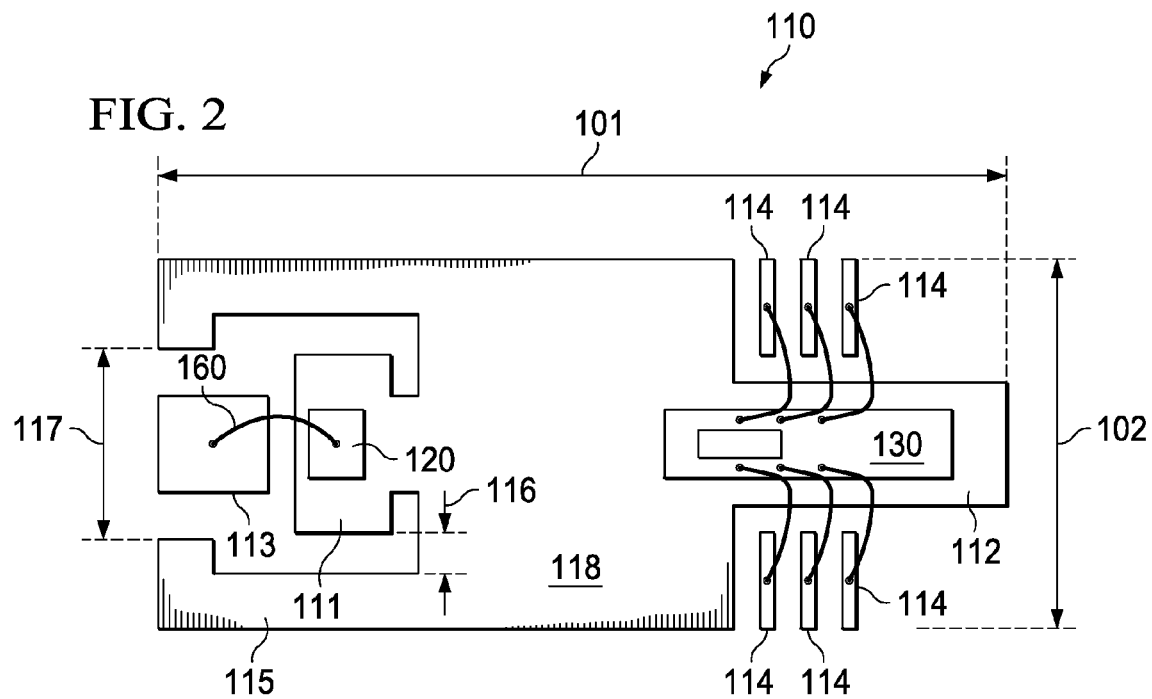

FABRICATING A PROXIMITY SENSOR HAVING LIGHT-BLOCKING STRUCTURE IN LEADFRAME

CROSS-REFERENCE TO RELATED APPLICATIONS

This application is a Divisional of and claims the benefit of the filing date of U.S. patent application Ser. No. 13/954,533 titled "PROXIMITY SENSOR HAVING LIGHT-BLOCKING STRUCTURE IN LEADFRAME" and filed Jul. 30, 2013 now U.S. Pat. No. 8,994,154, issued on Mar. 31, 2015—which claims priority to U.S. Provisional Patent Application Ser. No. 61/708,392 filed Oct. 1, 2012; the disclosure of which is hereby incorporated by reference herein in their entirety.

FIELD

Embodiments of the invention are related in general to the field of semiconductor devices and processes, and more specifically to the structure and fabrication method of molded proximity sensors with complete light blocking features embedded in the leadframe of the device.

DESCRIPTION OF RELATED ART

Semiconductor proximity sensors require a light-emitting chip, typically a light-emitting diode (LED), and a sensor chip. It is well known that for light in the infrared wavelength regime, sensor chips are extremely sensitive to background and stray light. It is therefore mandatory for semiconductor proximity sensors operating in the infrared regime to construct the package so that the package allows only light back into the sensor, which has first been emitted from the LED on the front side of the sensor and then comes bouncing back from the intended target. If any light would leak from the LED through the back side of the package (so-called cross talk), or if it had been reflected from anything else but the intended target, it would cause noise. Only a few percent of leaked light would cause the sensor to fail.

In known technology of semiconductor sensors, plastic proximity sensors are being built using dual molding processes. One molding step employs optically clear compound to create the dome-shaped lenses over the semiconductor devices in two separate cavities, and the other molding step employs optically opaque compound to fill in the space between the cavities and optically isolate the chips; the opaque compound can also be used to create shutters and light-blocking walls on the top side of the package. Two methodologies are being practiced. When clear compound is used in the first molding step and opaque compound is used in the second molding step, the substrate is made of fiberglass or ceramic to block any light emitted from the LED and arriving from the back side to the sensor; the molding step with opaque compound can also create tight shutters. This methodology has to accept the relatively high cost of fiberglass- or ceramic-made substrates.

On the other hand, when opaque compound is used in the first molding step to create the openings of the cavities and clear compound is used in the second molding step to fill in the openings and create the lenses, the substrate can be provided by relatively low cost metallic leadframes, since the opaque compound fills in the spaces between leads and pads for blocking stray light. On the other hand, in this process flow the opaque compound is not available to form shutters or light-blocking walls on the top side of the package.

SUMMARY OF THE INVENTION

Applicants realized that the relentless cost pressure on semiconductor proximity sensors favors the substrate usage of low-cost leadframes over higher cost ceramics or fiberglass. In addition, they acknowledged the practicality of using opaque molding compounds for creating low-cost and design-specific shutters. As a consequence, the usage of clear compound for the first molding step is the preferred methodology.

Applicants found a solution to the problem that the first-used clear molding compound fills the spaces between leads and pad of leadframes and thus may create light pipes and unacceptable cross talk in the proximity package, when they discovered a methodology combining the design of the leadframe to form a cell of opaque compound around the LED with the light-blocking capability of a solder barrier between the LED side of the proximity package and the sensor side.

One embodiment of the invention is a semiconductor proximity sensor having a leadframe with a solder layer on its outer surface. The proximity sensor includes a flat leadframe, which has a first and a second surface, with the second surface being solderable. The leadframe is designed to have a first and a second pad, a plurality of leads, and fingers which form a frame around the first pad while they are spaced from the first pad by a gap. This gap is filled with clear molding compound. The proximity sensor has an LED chip assembled on the first pad and encapsulated by a first volume of the clear compound, wherein the first volume is outlined as a first lens, and further a sensor chip assembled on the second pad and encapsulated by a second volume of the clear compound, wherein the second volume is outlined as a second lens. Opaque molding compound fills the space between the first and second volumes of clear compound, forms shutters for the first and second lenses, and forms walls rising from the frame of fingers in order to create enclosed cavity for the LED. The proximity sensor includes a layer of solder on the second surface of the leadframe pads, leads, and fingers.

Another embodiment of the invention is a method for fabricating a proximity having a leadframe with a light-blocking structure. The method starts by providing a flat leadframe with a first and a second surface; the second surface has a metallurgical surface preparation suitable for soldering. The leadframe includes a first and a second pad, a plurality of leads, and fingers framing the first pad, whereby the fingers are spaced from the first pad by a gap.

In the next process steps, a light-emitting diode (LED) chip is assembled on the first pad and a sensor chip is assembled on the second pad. The assembly of these chips include the steps of adhesively attaching the chip to the respective pad and wire bonding the chip to a respective lead.

In the next process steps, a clear polymeric compound is molded to fill the gap between the fingers and the first pad, further to encapsulate the assembled LED chip by a first volume of compound outlined as a first lens, and to encapsulate the assembled sensor chip by a second volume of compound outlined as a second lens. Then, an opaque polymeric compound is molded to fill the space between the first and second volumes of clear compound, further to form shutters for the first and second lenses, and to form walls rising from the frame of fingers, thus creating an enclosed cavity for the LED, which can prevent light from escaping from the cavity.

In the final process step, the proximity sensor is attached to a board (PCB) using a layer of solder to connect to the second leadframe surface. As an example, the solder layer may be provided by screening a solder paste. The solder layer blocks the escape route for light through the clear compound filling the gap between the first pad and the encircling leadframe fingers.

Alternatively, the leadframe is already provided with a layer of solder pre-deposited on the second leadframe surface. A preferred solder includes tin or a tin alloy; alternative solders are indium-gold and other low-melting binary alloys.

BRIEF DESCRIPTION OF THE DRAWINGS

FIG. 1 illustrates a cross section of a semiconductor proximity sensor assembled on a leadframe; a solder layer is pre-deposited on the leadframe, or is provided during the attachment step to a board.

FIG. 2 shows a top view of the proximity sensor of FIG. 1, depicting a embodiment of the leadframe fingers framing the assembly pad of the light-emitting diode.

DETAILED DESCRIPTION OF THE PREFERRED EMBODIMENTS

Figure 3:
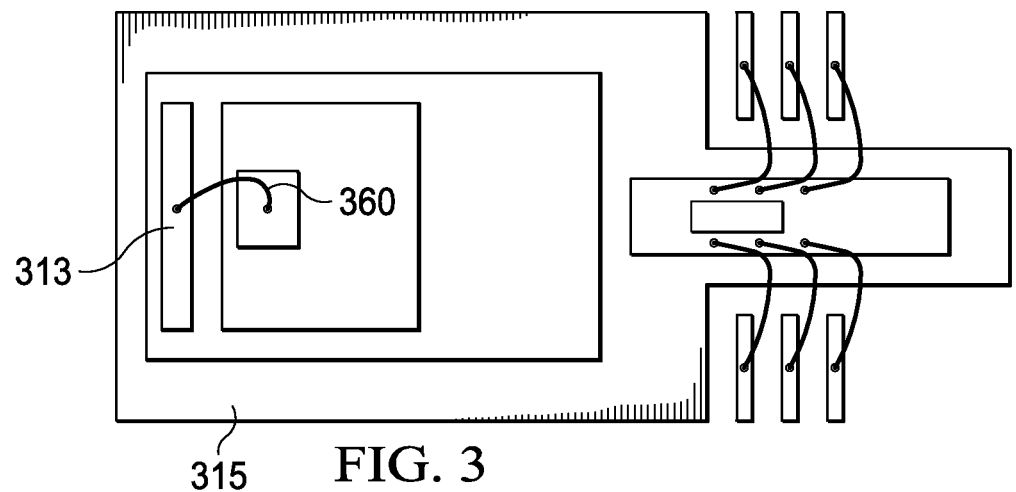
FIG. 3 shows a top view of the proximity sensor o FIG. 1, depicting another embodiment of the leadframe fingers framing the assembly pad of the light-emitting diode.

FIG. 1 illustrates an exemplary semiconductor proximity sensor generally designated 100, which employs a metallic leadframe 110 with a first (110a) and a second (110b) surface and a layer 180 of solder on the second surface. The components of proximity sensor 100 are assembled on the leadframe surface opposite the solder layer; the design of the leadframe is displayed in the top view of FIG. 2 before the assembly. As an example, proximity sensor 100 and leadframe 110 may have a length 101 of 4.0 mm and a width 102 of 2.0 mm; other proximity sensors may have the dimensions of length 4.0 mm and width 2.5 mm, or length 5.0 mm and width 2.5 mm, or length 3.94 mm and width 2.36 mm. Overall height 103 of the device may be 1.35 mm.

Proximity sensor 100 includes a light-emitting diode (LED) chip 120 and a sensor chip 130. In the example of FIG. 1, the light emitted by the LED is in the infrared regime; in other embodiments the light may be in the regime of shorter wavelengths. Chips 120 and 130 are encapsulated in volumes 140 and 145, respectively, of clear plastic compound. The compound is shaped as lenses 141 and 146, respectively. The plastic volumes are separated by opaque plastic compound 150, which also outlines the overall contours of the device package.

Referring now to FIG. 2, the top view shows the first surface of leadframe 110; the opposite second surface of leadframe 110 is not shown in FIG. 2. Leadframe 110 includes a first pad 111 for assembling the LED, a second pad 112 for assembling the sensor, a plurality of leads 113 (dedicated to the LED) and 114 (dedicated to the sensor), and fingers 115 and 118. In the exemplary embodiment, the leads as package terminals are not shaped as conventional cantilevered leads, but flat metal pins; consequently, the embodiment is classified as a plastic Small Outline No-lead (SON) package, frequently also called a Quad Flat No-lead (QFN) package.

It should be noted that herein, following widespread usage, package terminals 113 and 114 are referred to as pins, in spite of the fact that they have a flat surface and do not resemble pointed objects such as nails. When a leadframe is used for an embodiment to assemble a semiconductor chip on the leadframe pad and connect the chip input/output terminals to the leadframe leads, those leads are herein also referred to as pins. In the embodiment shown, the metal pins are coplanar with the surrounding plastic surface; in other embodiments, they may protrude a step of about 0.05 mm from the plastic surface.

The preferred base metal for the leadframe in FIG. 2 is copper or a copper alloy. Base metal alternatives include brass, aluminum, iron-nickel alloys (for instance the so-called Alloy 42), and Kovar™. Typically, the leadframe originates with a metal sheet with a preferred thickness in the range from about 100 to 300 μm; thinner sheets are possible. If needed, the ductility in this thickness range provides the 5 to 15% elongation that facilitates an intended bending and forming operation. The configuration or structure of the leadframe is stamped or etched from the starting metal sheet.

As defined herein, the starting material of the leadframe is called the "base metal", indicating the type of metal. Consequently, the term "base metal" is not to be construed in an electrochemical sense (as in opposition to "noble metal") or in a structural sense.

FIG. 1 indicates that pads 111 and 112 serve the adhesive attachment and assembly of chip 120 and chip 130, respectively. FIG. 1 also shows that leads 113 and 114 serve the attachment of wire stitch bonds on the first surface of the leadframe. Consequently, the first surface of the leads has to be bondable. Dependent on the selected base metal of the leadframe, bondability may have to be enhanced by a metallurgical preparation of the first surface of the leads, such as additional spot plating with a layer of silver, or palladium, or gold. It is shown in FIG. 1 that the second surface of the leadframe, including pads, leads, and fingers, is suitable for soldering. This requirement may necessitate a metallurgical preparation of the second surface, such as plating the base metal with a layer of tin, or with a layer of nickel followed by a thin layer of palladium, or palladium and gold, and then a thick layer of tin or tin alloy.

For some devices it may be advantageous to half-etch at least portions of the pads, leads, and fingers in order to create structures, which enhance molding compound adhesion and thermal heat spreading. Suitable structures include rims as mold locks.

Referring now to FIG. 2, the leadframe fingers 115 and 118, which frame first pad 111, are spaced from pad 111 by a gap of width 116. Fingers 115 and 118 are designed so that they encircle first pad 111 to form a cell onto which a wall of opaque molding compound can be fabricated; this walled-in cell acts a cavity for the LED assembled on pad 111, from which none or only minimal light can escape. As is pointed out below, when the gap of width 116 is filled with clear molding compound and thus stray light could manage to escape through the clear-filled gap, it will be fully blocked from progressing further by solder layers 180 (see FIG. 1).

In the embodiment of FIG. 2, fingers 115 leave an opening 117 for placing lead 113, onto which the stitch bond of the LED bonding wire 160 is attached. In another embodiment shown in FIG. 3, fingers 315 encircle a fully closed cell. Pad 313 for the stitch bond of the LED binding wire 360 is re-arranged inside the cell.

Referring to FIG. 1, the LED chip 120 attached onto first pad 111 and wire-bonded to lead 113 is encapsulated by a first volume 140 of clear molding compound, which is bordered beyond diameter 142 by opaque molding compound 150. For the exemplary embodiment of FIG. 1, the characteristics of "clear" refer primarily to infrared light wavelengths, and the characteristic of "opaque" refer primarily the infrared wavelengths. For other embodiments, the characteristics of "clear" may refer to other light wavelengths, especially in the visible wavelength regime, and "opaque" may refer to blocking primarily the visible wavelengths. As FIG. 1 indicates, the first compound volume is outlined by a contour configured as a first lens 141. The contours of lens 141 intend focus the light emitted by the LED within the operational regime of device 100.

The sensor chip 130 attached onto second pad 112 and wire-bonded to leads 114 is encapsulated by a second volume 145 of clear molding compound, which is bordered beyond diameter 147 by opaque molding compound 150. Second volume 145 has a contour configured as a second lens 146. The contour of second lens 146 intends to collect infrared light arriving as reflected signal and forward the light to sensor 130. In addition, the clear molding compound of second volume 145 has an appended portion 145a, which encapsulates the full extent of sensor chip 130. Appendix 145a, in turn, is overlaid by a layer 151 of opaque compound. As stated above, for the exemplary embodiment of FIG. 1, the characteristics of "clear" refer primarily to infrared light wavelengths, and the characteristic of "opaque" refer primarily the infrared wavelengths, while for other embodiments, the characteristics of "clear" may refer to other light wavelengths, especially in the visible wavelength regime, and "opaque" may refer to blocking primarily the visible wavelengths.

As FIG. 1 shows, the opaque compound provides a plurality of functions. It fills the space between first volume 140 and second volume 145; it acts as shutters to define the diameters 142 and 147 of the first lens 141 and the second lens 146; it covers as appendix 151 the extent of light sensor 130 beyond diameter 147; and it further forms the walls 104 rising from the fingers (115 in FIGS. 1 and 315 in FIG. 3) of the leadframe to create an enclosed cavity of LED chip 120.

As mentioned above, the layers 180 of solder, which attach the second surface of all leadframe portions to metallized pads on a PCB surface during the solder reflow step, may be provided by plated layers on the second leadframe surface; alternatively, it may be provided by solder paste screened or deposited on the PCB before the attachment. Independent of the method of providing the solder alloy, the solder layers under fingers 115 and leadframe portion 118 will block any light escaping from the cavity surrounding LED chip 120 and thus prevent any noise disturbing the proper operation of sensor 130.

Another embodiment of the invention is a method for fabricating a proximity sensor 100 having a leadframe with a light-blocking structure. The method starts by providing a flat leadframe 110 with a first and a second surface; the second surface has a metallurgical surface preparation suitable for soldering. The leadframe includes a first and a second pad (111 and 112, respectively), a plurality of leads (113, 114), and fingers (115, 118) framing the first pad, whereby the fingers are spaced from the first pad by a gap 116.

In the next process steps, a light-emitting diode (LED) chip 120 is assembled on first pad 111 and a sensor chip 130 is assembled on second pad 112. The assembly of these chips include the steps of adhesively attaching the chips to the respective pads and wire bonding the chips to respective leads.

In the next process steps, a clear polymeric compound is molded to fill the gap 116 between the fingers and the first pad, further to encapsulate the assembled LED chip 120 by a first volume 140 of compound outlined as a first lens 141, and to encapsulate the assembled sensor chip 130 by a second volume 145 and 145a of compound outlined as a second lens 146. Then, an opaque polymeric compound is molded to fill the space between the first and second volumes of clear compound, further to form shutters (such as 151) for the first and second lenses, and to form walls rising from the frame of fingers (such as wall 150 over leadframe portion 118), thus creating an enclosed cavity for the LED, which can prevent light from escaping from the cavity.

In the final process step, the proximity sensor with its pads, leads, and fingers is attached to a board (PCB) using a layer 180 of solder to connect to the second leadframe surface. As an example, the solder layer may be provided by screening a solder paste and reflowing it during the attachment step. Solder layer 180 blocks the escape route for light through the clear compound filling the gap 116 between the first pad 111 and the encircling leadframe fingers 115 and 118.

Alternatively, the leadframe is already provided with a layer of solder pre-deposited on the second leadframe surface. A preferred solder includes tin or a tin alloy; alternative solders are indium-gold and other low-melting binary alloys.

Figure 4:
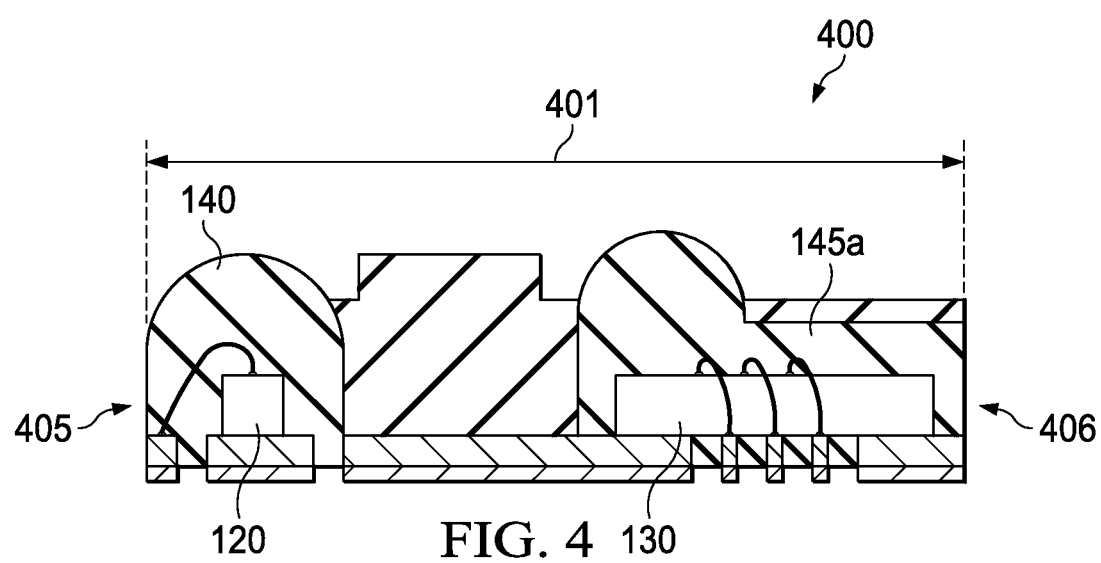
FIG. 4 illustrates a cross section of another semiconductor proximity sensor assembled on a leadframe; the device having opposite sides un-covered by opaque compound; a solder layer is pre-deposited on the leadframe, or is provided during the attachment step to a board.

For devices where miniaturization of the dimensions is at a premium, FIG. 4 illustrates an exemplary embodiment 400 with the opposite sides 405 and 406 of the device un-covered by the opaque molding compound. While device 400 of FIG. 4 is generally analogous to device 100 of FIG. 1, device 400 has a reduced length 401 compared to length 101 by not placing opaque molding compound at the opposite sides of the device and thus leaving these opposite sides without light-absorbing cover. While this feature may allow some light to escape from the LED 120, cross talk to sensor 130 is still minimized since the clear compound 140 and 145a is only exposed on opposite ends of the package of device 400.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to SON/QFN packages with side lengths of 4.0 mm, but to packages with scaled dimensions, especially to packages with smaller side lengths.

As another example, the concept of a small plastic leadframe-based package with SON/QFN pins and clear and opaque encapsulation compounds can be applied to packages with various lens shapes and lens distances suitable for light wavelengths other than infrared.

In yet another example, the material and the thickness of the metal leadframe can be selected as a function of the size of the chip so that specific product goals of the assembled package can be achieved such as final thickness, mechanical strength, minimum warpage, prevention of cracking, strong symbolization contrast, compatibility with pick-and-place machines, and minimum electrical parasitics. In addition, the starting metal of the plate may be roughened, or plated with metal layers (such as nickel, palladium, gold, and tin), to improve adhesion to polymeric compounds and solderablity to PCBs.

It is therefore intended that the appended claims encompass any such modifications or embodiments.

We claim:

1. A method for fabricating a semiconductor proximity sensor comprising:
   providing a flat leadframe having a first and a second surface, the second surface being solderable, the leadframe including a first and a second pad, a plurality of leads, and fingers framing the first pad, the fingers spaced from the first pad by a gap;

assembling a light-emitting diode (LED) chip on the first pad;

assembling a sensor chip on the second pad;

molding clear compound to fill the gap, encapsulate the assembled LED chip by a first volume of compound outlined as a first lens, and encapsulate the assembled sensor chip by a second volume of compound outlined as a second lens;

then molding opaque compound to fill the space between the first and second volumes of clear compound, form shutters for the first and second lenses, and form walls rising from the frame of fingers for creating an enclosed cavity for the LED; and connecting the pads, leads, and fingers to a board using a layer of solder for attaching the proximity sensor.

2. The method of claim 1 leaving a gap between the finger tips of the fingers framing the first pad tips for placing a lead.

3. The method of claim 2 placing an LED bonding wire in the gab and attaching the stitch bond of the LED bonding wire.

4. The method of claim 1 encircling the first pad as well as the lead carrying the LED stitch bond with the fingers.

5. A method for fabricating a semiconductor proximity sensor comprising:

providing a flat leadframe having a first and a second surface, the second surface being solderable, the leadframe including a first and a second pad, a plurality of leads, and fingers framing the first pad, the fingers spaced from the first pad by a gap;

depositing a layer of solder on the second surface of the leadframe;

assembling a light-emitting diode (LED) chip on the first pad;

assembling a sensor chip on the second pad;

molding clear compound to fill the gap, encapsulate the assembled LED chip by a first volume of compound outlined as a first lens, and encapsulate the assembled sensor chip by a second volume of compound outlined as a second lens; and then molding opaque compound to fill the space between the first and second volumes of clear compound, form shutters for the first and second lenses, and form walls rising from the frame of fingers for creating an enclosed cavity for the LED.

\* \* \* \* \*